United States Patent
Kurata

(10) Patent No.: US 9,807,920 B2
(45) Date of Patent: Oct. 31, 2017

(54) ELECTRONIC COMPONENT MOUNTING SYSTEM

(71) Applicant: PANASONIC INTELLECTUAL PROPERTY MANAGEMENT CO., LTD., Osaka (JP)

(72) Inventor: Hiroaki Kurata, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 221 days.

(21) Appl. No.: 14/436,719

(22) PCT Filed: Oct. 23, 2013

(86) PCT No.: PCT/JP2013/006275
§ 371 (c)(1),
(2) Date: Apr. 17, 2015

(87) PCT Pub. No.: WO2014/064938
PCT Pub. Date: May 1, 2014

(65) Prior Publication Data
US 2016/0174426 A1   Jun. 16, 2016

(30) Foreign Application Priority Data

Oct. 23, 2012   (JP) ................. 2012-233400

(51) Int. Cl.
*H05K 13/08*   (2006.01)

(52) U.S. Cl.
CPC .................... *H05K 13/08* (2013.01)

(58) Field of Classification Search
CPC .......... B23P 19/00; B23P 13/08; G06F 17/30; G06F 17/3002; G06F 19/00; H05K 3/30; H05K 13/02; H05K 13/04
See application file for complete search history.

(56) References Cited

U.S. PATENT DOCUMENTS

| | | | |
|---|---|---|---|
| 6,944,521 B2* | 9/2005 | Yoshida | H05K 13/08 700/169 |
| 7,010,378 B2* | 3/2006 | Ohishi | G06Q 10/06 700/115 |

(Continued)

FOREIGN PATENT DOCUMENTS

| | | |
|---|---|---|
| CN | 1728933 A | 2/2006 |
| CN | 1878460 A | 12/2006 |

(Continued)

OTHER PUBLICATIONS

Chinese Office Action and Search Report for Chinese Patent Application No. 201380048986.3 dated Aug. 15, 2016.

(Continued)

*Primary Examiner* — Carl Arbes
(74) *Attorney, Agent, or Firm* — Pearne & Gordon LLP

(57) ABSTRACT

An electronic component mounting system includes plural mounting line systems, and an integrated system capable of communication with the plural mounting line systems. The mounting line systems have an electronic component mounting line, a mounting line management unit, and an identification information reading unit. If identification information read by the identification information reading unit is not stored in an integrated database, a component information reading unit included in the mounting line management unit reads from a local database the identification information and information about a use status of electronic components housed in an electronic component housing body to which the identification information is attached.

3 Claims, 4 Drawing Sheets

(56) References Cited

U.S. PATENT DOCUMENTS

| | | | | |
|---|---|---|---|---|
| 2003/0109945 A1* | 6/2003 | Cho | ............... | G05B 19/41875 |
| | | | | 700/95 |
| 2006/0020361 A1* | 1/2006 | Ohishi | ................. | G06Q 10/06 |
| | | | | 700/115 |
| 2006/0079984 A1 | 4/2006 | Ohishi et al. | | |
| 2008/0098591 A1* | 5/2008 | Isoda | ................... | H05K 13/08 |
| | | | | 29/740 |

FOREIGN PATENT DOCUMENTS

| | | | |
|---|---|---|---|
| CN | 102348369 A | * | 2/2012 |
| CN | 102348369 A | | 2/2012 |
| JP | 5-285753 A | | 11/1993 |
| JP | 11-117420 A | | 4/1999 |
| JP | 11347859 A | * | 12/1999 |
| JP | 2004-140162 A | | 5/2004 |
| JP | 2008-78235 A | | 4/2008 |
| JP | 2009-135176 A | | 6/2009 |
| JP | 4291586 B2 | * | 7/2009 |
| JP | 4301853 B2 | * | 7/2009 |
| WO | 2004/103052 A1 | | 11/2004 |

OTHER PUBLICATIONS

International Search Report for Application No. PCT/JP2013/006275 dated Dec. 3, 2013.

\* cited by examiner

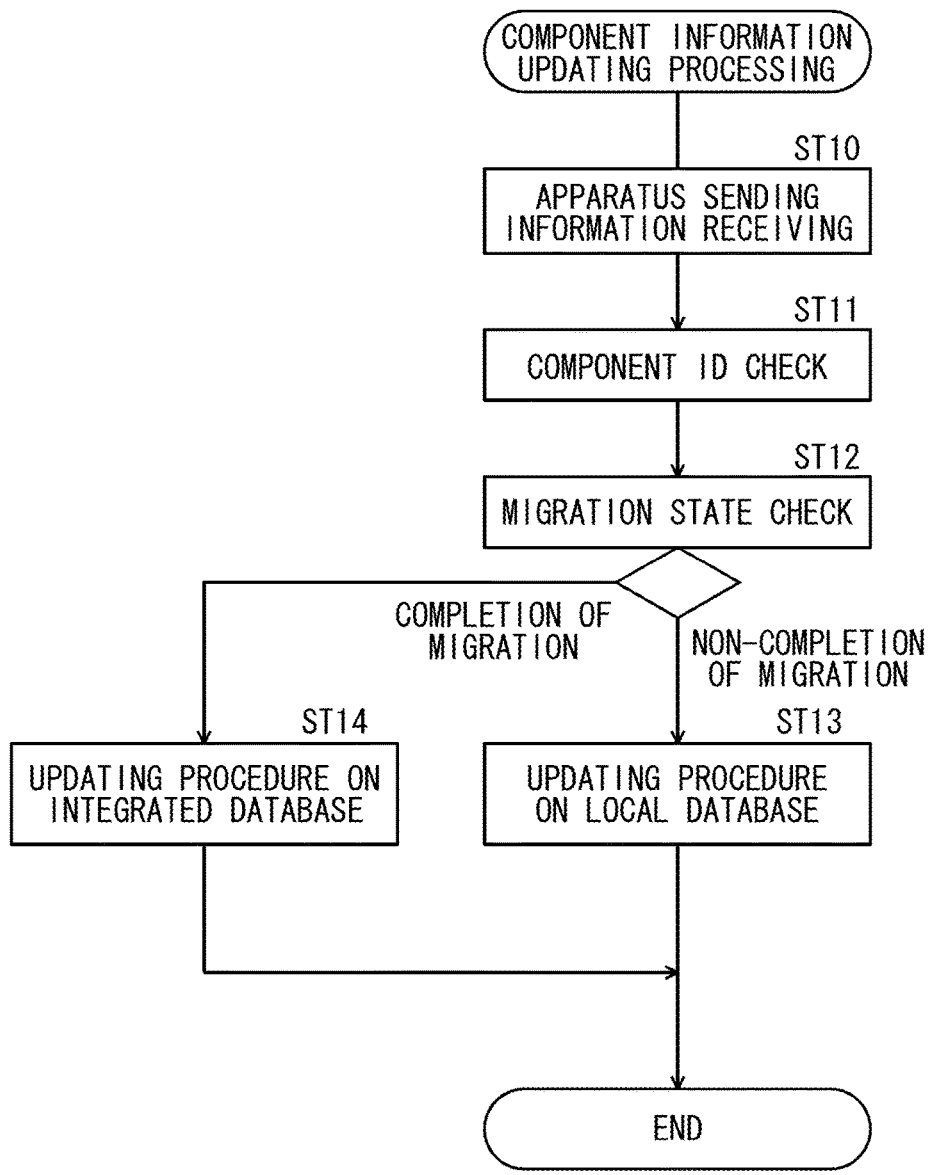

ELECTRONIC COMPONENT MOUNTING SYSTEM

TECHNICAL FIELD

The present invention relates to an electronic component mounting system including an integrated system capable of communication between plural mounting line systems.

BACKGROUND ART

In the electronic component mounting field in which electronic components are mounted on a substrate to produce a mounting substrate, an electronic component mounting line including plural electronic component mounting apparatuses is generally used, and the electronic component mounting apparatuses include, for example, a paste supply apparatus for supplying paste such as solder to an electrode of the substrate, an appearance inspection apparatus for inspecting a state of adhesion of the paste to the electrode, an electronic component mounting apparatus for pitch-feeding a carrier tape wound on a supply reel as an electronic component supply body and taking out an electronic component housed in the carrier tape by a mounting head and mounting the electronic component on the electrode of the substrate, and a reflow apparatus for heating the substrate after mounting the electronic component.

The plural electronic component mounting lines are often arranged inside one production factory, and a form in which these plural electronic component mounting lines are connected to a management system including a CPU through communication means such as a LAN cable and can be mutually communicated to the management system is known. Then, the plural electronic component mounting lines and the management system to which these lines are connected are built as one mounting line system (equipment vendor).

In the case of doing mounting work using the mounting line system described above, a method for attaching identification information every electronic component supply body (supply reel herein) and performing management using the management system is known in order to grasp, for example, use status of electronic components or the number of remaining electronic components. Management of the number of remaining electronic components is described by way of example. In a database had by the management system, component information about, for example, a kind and the number of electronic components housed in each supply reel is previously stored in correspondence with the identification information, and when a carrier tape is pitch-fed once in the mounting work, the management system sequentially updates processing in which the number of electronic components stored in the database is decremented by one and thereby, the number of remaining electronic components is managed.

PRIOR ART REFERENCE

Patent Reference

Patent Reference 1: JP-A-11-117420

SUMMARY OF THE INVENTION

Problems that the Invention is to Solve

In order to introduce a new mounting line system into a production factory by expansion of production scale etc. and share component information about, for example, the number of remaining electronic components between the plural mounting line systems, it is necessary to integrate a database of each of the mounting line systems. However, since it takes a huge amount of time to do integration work of the databases and also it is necessary to stop operation of the electronic component mounting lines, it is practically difficult to integrate the databases. As a result, even in the case of using a supply reel in which common electronic components are housed, it becomes difficult to perform operation (mutual use of the supply reel) in which the supply reel prepared for use in one mounting line system is brought in the other mounting line system and is used, and a problem of producing a wasted cost by ordering an essentially unnecessary supply reel arises. Thus, the component information cannot be shared between the plural mounting line systems and thereby, the cost is increased and wasted stock is caused and also, an improvement in production efficiency of a mounting substrate in each of the mounting line systems is hindered.

Hence, an object of the invention is to provide an electronic component mounting system capable of easily sharing information about a use status of electronic components between each of the mounting line systems without stopping operation of an electronic component mounting line.

Solution to Problems

An electronic component mounting system according to the invention includes plural mounting line systems, and an integrated system capable of communication with the plural mounting line systems, wherein the plural mounting line systems includes an electronic component mounting line including an electronic component mounting apparatus that takes an electronic component out of an electronic component housing body in which plural electronic components are housed and mounts the electronic component on a substrate, mounting line management means which is connected to the electronic component mounting apparatus and includes a local database for storing information about a use status of the electronic components in a unit of the electronic component housing body, and identification information reading means which is communicably connected to the mounting line management means and reads identification information attached to the electronic component housing body, and the mounting line management means includes component information reading means that, when the identification information read by the identification information reading means is not stored in an integrated database of the integrated system, reads from the local database and stores in the integrated database the identification information and information about a use status of the electronic components housed in the electronic component housing body to which the identification information is attached.

Advantage of the Invention

According to the invention, information about the use status of the electronic components housed in the electronic component housing body can be migrated from the local database to the integrated database without stopping operation of the mounting line system.

BRIEF DESCRIPTION OF THE DRAWINGS

FIG. 4 is an action explanatory diagram in the electronic component mounting system of one embodiment of the invention.

MODE FOR CARRYING OUT THE INVENTION

Figure 1:
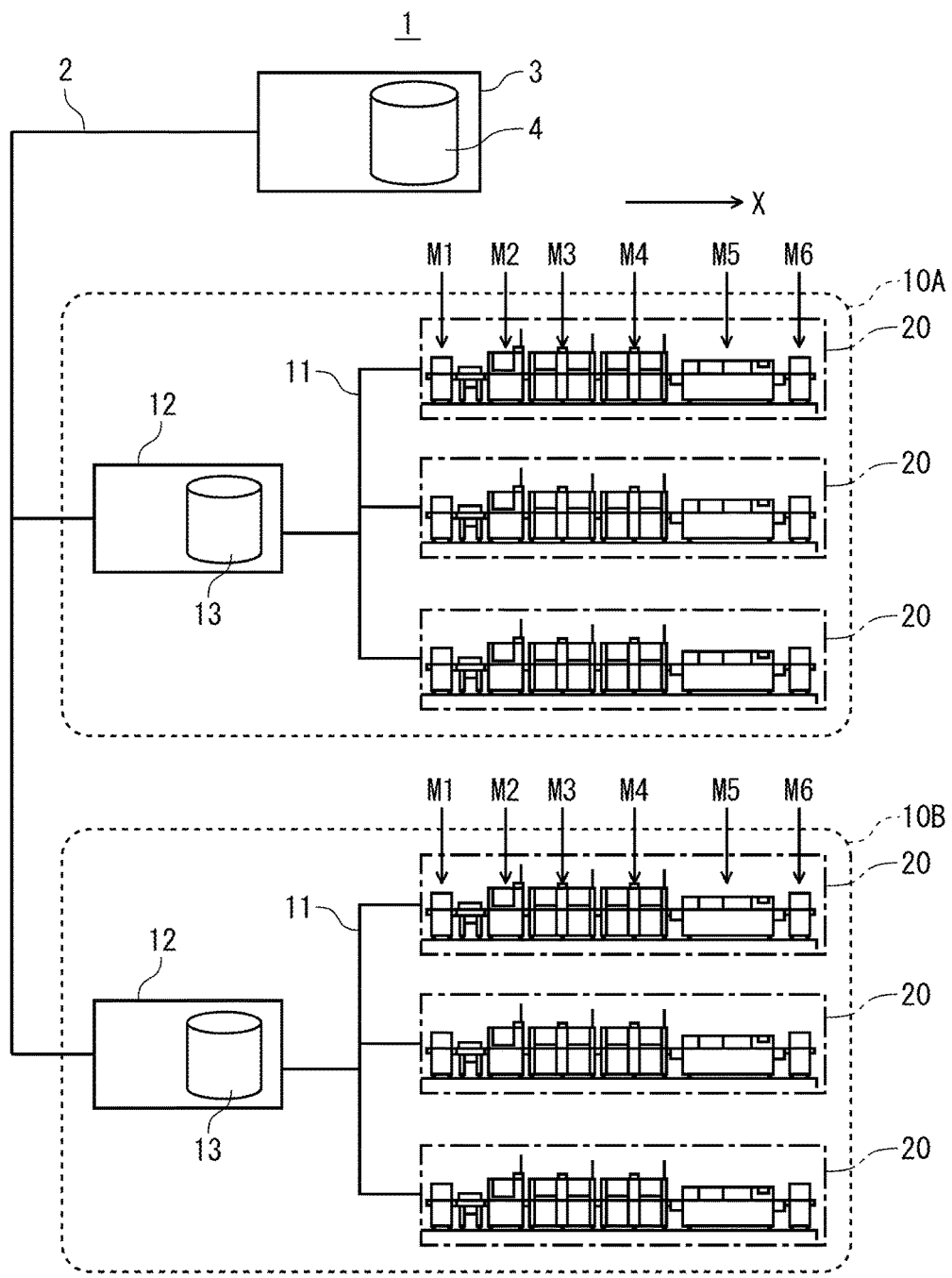
FIG. 1 is the whole configuration diagram of an electronic component mounting system of one embodiment of the invention.

An embodiment of the invention will be described with reference to the drawings. In FIG. 1, an electronic component mounting system 1 has a function of manufacturing a mounting substrate in which electronic components P (see FIG. 2) is mounted on a substrate (not shown), and is configured to communicably connect plural (two herein) mounting line systems 10A, 10B to an integrated system 3 including a CPU through a communication network 2 as communication means. The integrated system 3 integrates and manages information about various component mounting work executed in each of the mounting line systems 10A, 10B (the details are described below).

In FIG. 1, each of the mounting line systems 10A, 10B is configured to communicably connect plural electronic component mounting lines 20 (three lines herein) to a management system 12 including a CPU through a communication network 11. The electronic component mounting line 20 includes plural component mounting apparatuses for doing various component mounting work of mounting the electronic components P on the substrate to which solder paste is supplied, and is configured to join a substrate supply apparatus M1, a screen printing apparatus M2, electronic component mounting apparatuses M3, M4, a reflow apparatus M5, and a substrate recovery apparatus M6 linearly in a substrate conveyance direction (X direction) from the upstream side (left side in FIG. 1).

The substrate supply apparatus M1 is arranged in the head of the electronic component mounting line 20, and supplies a substrate on which the electronic components P are to be mounted to the screen printing apparatus M2. The screen printing apparatus M2 prints the solder paste on an electrode formed on an upper surface of the substrate by screen printing. The electronic component mounting apparatuses M3, M4 receive the substrate after the screen printing from the screen printing apparatus M2, and take the electronic component P out of a supply reel 21 (see FIG. 2) in which the plural electronic components P are housed, and mount the electronic component P on the substrate. The substrate recovery apparatus M6 recovers the substrate carried out of the reflow apparatus M5.

In addition, the electronic component mounting line 20 in the embodiment includes two electronic component mounting apparatuses, but the number of electronic component mounting apparatuses is freely selected and at least one electronic component mounting apparatus could be included and also, arrangement or a configuration of the component mounting apparatuses is not limited to the embodiment.

Figure 2:
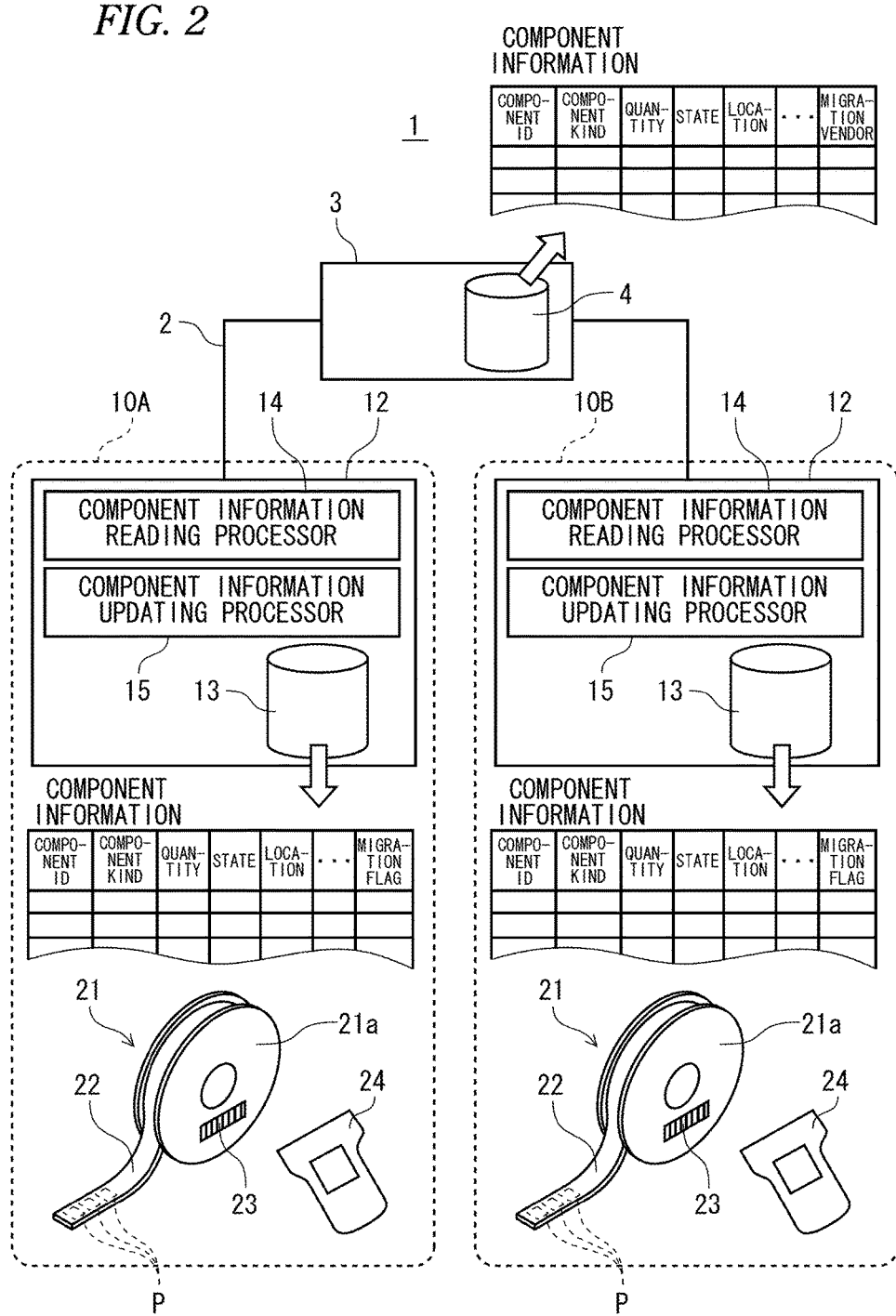
FIG. 2 is an explanatory diagram showing a control system of the electronic component mounting system of one embodiment of the invention.

Next, the supply reel 21 used in the electronic component mounting apparatuses M3, M4 will be described. In FIG. 2, the supply reel 21 is an electronic component housing body in which plural electronic components P mounted on the substrate are housed, and is configured to wind a carrier tape 22 in which the plural electronic components P are housed in series on a reel body part 21a. The supply reel 21 is arranged in a predetermined place of each of the electronic component mounting apparatuses M3, M4 with the supply reel 21 set in a tape feeder (not shown) having a function of pitch-feeding the carrier tape 22. In addition, the plural supply reels 21 are arranged in the electronic component mounting apparatuses M3, M4 through the tape feeder.

A bar code 23 as a record medium for recording a component ID (identification information) for individually identifying the supply reel 21 is stuck on a surface of the reel body part 21a. Also, each of the mounting line systems 10A, 10B includes a bar code reader 24 connected to the management system 12 by wireless or wire. This bar code reader 24 has a function of reading the bar code 23 attached to the supply reel 21, and sends information (hereinafter called "bar code information") about the read bar code 23 to the management system 12. The management system 12 performs management of the supply reel 21 described below by checking the component ID included in the bar code information sent from the bar code reader 24 and checks whether there is a mistake in selection or an attachment place of the supply reel 21 in the electronic component mounting apparatuses M3, M4 or not. That is, the bar code reader 24 forms identification information reading means which is communicably connected to the management system 12 and reads identification information attached to the electronic component housing body.

The electronic component mounting apparatuses M3, M4 pitch-feed the carrier tape 22 set in the tape feeder, and position electronic components P in a component takeout port, and take out the electronic components P in the takeout port by a mounting head (not shown) included by the electronic component mounting apparatuses M3, M4, and execute component mounting work of mounting the electronic components P on a substrate. Also, the electronic component mounting apparatuses M3, M4 have a function of sending operation information (for example, an operation rate, information about occurrence of various mistakes or the number of substrates produced) about the component mounting work, component use information (for example, the number of electronic components used or the number of remaining electronic components) and trace information (information for tracing an electronic component mounted on a substrate from a finished product into which the substrate is incorporated) to the management system. 12 through the communication network 11. In addition, in the present description, these pieces of information sent from the electronic component mounting apparatuses M3, M4 are called "apparatus sending information".

Next, the integrated system 3 of the electronic component mounting system 1 will be described with reference to FIG. 2. The integrated system 3 includes an integrated database 4. This integrated database 4 can be accessed from each of the mounting line systems 10A, 10B, and information about the integrated database 4 can be referred to, registered and updated by a component information reading processor 14 or a component information updating processor 15 described below. This integrated database 4 is prepared to store information distributed and stored to local databases 13, 13 of each of the mounting line systems 10A, 10B in one place, and centralizes and manages information handled by the electronic component mounting system 1 having the plural mounting line systems 10A, 10B.

Next, the management system 12 of the electronic component mounting system 1 will be described with reference to FIG. 2. The management system 12 collects and manages various pieces of information included in the apparatus sending information sent from the electronic component mounting apparatuses M3, M4 every electronic component mounting line 20, and includes the local database 13, the component information reading processor 14 and the component information updating processor 15. This management system 12 manages information about component mounting work in the electronic component mounting apparatuses M3, M4 by sequentially updating or storing information stored in the local database 13 based on the apparatus sending information sent from the electronic component mounting apparatuses M3, M4.

The local database 13 stores operation information, trace information, and component information. The component information is stored in the local database 13 in a unit of the supply reel 21. Here, the component information includes, with the component ID of the supply reel 21, information about the supply reel 21 and use state of electronic components P housed in the supply reel 21, for example, a "component kind" indicating a kind of electronic components P housed in the supply reel 21 on which a component ID is recorded, "quantity" indicating the number of electronic components P remaining housed in the supply reel 21, a "state" indicating that the supply reel 21 can be used or is in present use or cannot be used or has already been used, and a "location" indicating an arrangement place of the supply reel 21 inside the electronic component mounting apparatuses M3, M4 and information for pinpointing the electronic component mounting apparatuses M3, M4 in which the supply reel 21 is arranged. That is, the management system 12 forms mounting line management means which is connected to the electronic component mounting apparatuses M3, M4 and includes the local database 13 for storing the information about the use status of the electronic component in the unit of the electronic component housing body. In addition, the component information could include at least the component ID and the quantity indicating the number of electronic components P remaining.

The component information reading processor 14 is means for executing component information reading processing described below, and checks a state of migration to the integrated database 4 in component information matching with a component ID included in bar code information sent from the bar code reader 24, and executes processing for storing component information about the corresponding component ID stored in the local database 13 in the integrated database 4 when the migration has not been completed. Concretely, in the case of deciding that the component ID of the supply reel 21 read by the bar code reader 24 is not stored in the integrated database 4, the component information reading processor 14 reads component information about the electronic components P housed in the supply reel 21 to which the component ID is attached together with its component ID from the local database 13, and stores the component information in the integrated database 4 of the integrated system 3.

The component information updating processor 15 is means for executing processing (component information updating processing) for updating component information stored in the integrated database 4 or the local database 13 based on component use information included in the apparatus sending information from the electronic component mounting apparatuses M3, M4. Concretely, in component information about a component ID matching with a component ID included in the component use information, a state of migration to the integrated database 4 is checked, and when the migration has already been completed, component information about the corresponding component ID stored in the integrated database 4 is updated, and when the migration has not been completed, component information stored in the local database 13 is updated.

The electronic component mounting system 1 in the embodiment has the configuration as described above. Next, a method for migrating component information stored in the local database 13 of the plural mounting line systems 10A, 10B to the integrated database 4 of the integrated system 3 will be described. In the mounting line systems 10A, 10B, work of, for example, replacement of the supply reel 21 associated with consumption of electronic components P is done on a daily basis in mounting work (in apparatus operation) or at the time of work of switching of the supply reel 21 associated with a change in a kind of mounting substrate produced or at the time of work of a setup of the supply reel 21 before the start of work in the electronic component mounting apparatuses M3, M4.

In order to support the work by a worker, the mounting line systems 10A, 10B have a support function of checking whether or not wrong work is done or a function of instructing the worker on a place of attachment of the supply reel 21 in the electronic component mounting apparatuses M3, M4 by reading the bar code 23 of the supply reel 21 targeted for work by the bar code reader 24. The invention has a feature that processing for migrating component information stored in the local database 13 to the integrated database 4 is performed using bar code reading of the supply reel 21 associated with daily work as a trigger.

Figure 3:
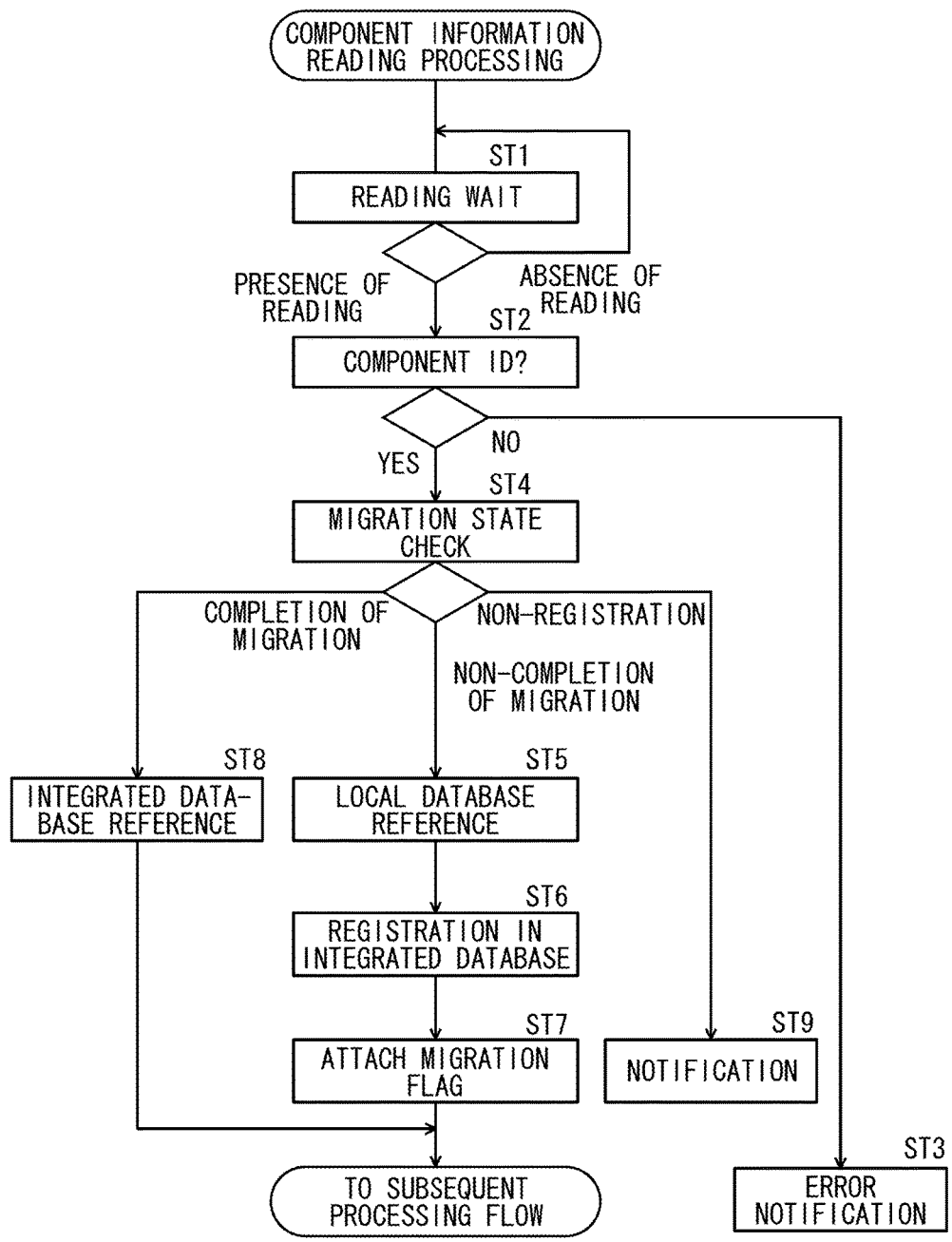
FIG. 3 is an action explanatory diagram in the electronic component mounting system of one embodiment of the invention.

An action of component information reading processing by the component information reading processor 14 will hereinafter be described with reference to FIG. 3. First, the management system 12 waits until reading of a bar code by the bar code reader 24 (a bar code reading wait step of ST1). Then, when a worker reads the bar code 23 stuck on the supply reel 21 by the bar code reader 24, bar code information is sent from the bar code reader 24 to the management system 12. Then, the component information reading processor 14 checks whether or not a component ID is included in the bar code information (a component ID check step of ST2), and in the case of deciding that the component ID is not included, the worker is notified that an error occurs (an error notification step of ST3).

Then, in the case of deciding that the component ID is included, the component information reading processor 14 checks whether or not the component ID has already been migrated to the integrated database 4 (a migration state check step of ST4). In other words, the component information reading processor 14 decides whether or not the read component ID is stored in the integrated database 4 by referring to the integrated database 4. Then, when the component ID is not stored in the integrated database 4, the component information reading processor 14 refers to the local database 13 and reads component information to which the component ID is attached (a local database reference step of ST5).

Then, the component information reading processor 14 adds information about amounting line system (a "migration vendor") of a migration source to the read component information, and registers the information in the integrated database 4 of the integrated system 3 (an integrated database registration step of ST6). Accordingly, the read component information about the supply reel 21 is migrated to the integrated database 4. Thus, the component information reading processor 14 forms component information reading means for reading information about a use status of an electronic component housed in the electronic component housing body to which the identification information is attached together with its identification information from the local database 13 and storing the information in the integrated database 4 when the identification information read by the identification information reading means is not stored in the integrated database 4 of the integrated system 3.

Next, the component information reading processor 14 attaches, to the component ID targeted for migration stored in the local database 13, information (migration flag (see FIG. 2)) to that effect (an already-migrated display attaching step of ST7).

On the other hand, when the component ID read by the bar code reader 24 is stored in (already migrated to) the integrated database 4 in (ST4), the management system 12 refers to the integrated database 4, and reads a component ID stored in the integrated database 4 and information about a use status of the electronic components P corresponding to the component ID (an integrated database reference step of ST8). In addition, the case where the component ID read by the bar code reader 24 is already stored in the integrated database 4 includes the case where the integrated database registration step of (ST6), that is, data migration to the integrated database 4 has already been completed in either mounting line system.

Also, when the read component ID is not stored in the local database 13 as well as the integrated database 4 in (ST4), the management system 12 notifies the worker of that effect (a notification step of ST9). Then, when the read component ID is not stored by mistake, the worker performs new registration work in which the component ID and component information about the electronic components P housed in the supply reel 21 to which the component ID is attached are registered in the local database 13 and the integrated database 4.

By executing the action of component information reading processing described above, component information stored in the local database 13, 13 of each of the mounting line systems 10A, 10B can be migrated to the integrated database 4 in a simple configuration of only adding the component information reading processor 14 to the existing management system 12. Accordingly, the supply reel 21 used in each of the mounting line systems 10A, 10B and information about a use status of the electronic components P housed in the supply reel 21 can be shared on the integrated system 3.

Also, according to this method, the worker only performs daily work to thereby migrate data, with the result that it is unnecessary to stop operation of the plural mounting line systems 10A, 10B and also, information about the use status of the electronic components P can be shared without decreasing production efficiency of a mounting substrate. Moreover, since information about the necessary supply reel 21 to be used in the mounting line systems 10A, 10B is migrated to the integrated database 4, an effect capable of reducing human and facility costs due to migrating information about an old supply reel 21 which has no opportunity for use or an empty supply reel 21 without an electronic component can also be expected.

Next, an updating processing action of component information (a component information updating processing action) will be described with reference to FIG. 4. The component information updating processor 15 is means for executing processing for updating component information stored in the integrated database 4 or the local database 13 based on component use information included in the apparatus sending information sent from the electronic component mounting apparatuses M3, M4. Concretely, in component information about a component ID matching with a component ID included in the component use information, a state of migration to the integrated database 4 is checked, and when the migration has already been completed, component information about the corresponding component ID stored in the integrated database 4 is updated, and when the migration has not been completed, component information about the component ID of the local database 13 is updated.

First, the management system 12 receives apparatus sending information sent from the electronic component mounting apparatuses M3, M4 (an apparatus sending information receiving step of ST10). Next, the component information updating processor 15 extracts component use information included in the apparatus sending information received by the management system 12, and checks a component ID included in the component use information (a component ID check step of ST11). Then, it is checked whether or not the checked component ID has already been migrated to the integrated database 4 (stored in the integrated database 4) (a migration state check step of ST12).

Then, in the case of deciding that the component ID has not been migrated in (ST12), the component information updating processor 15 updates component information about the component ID stored in the local database 13 based on the apparatus sending information (a local database updating processing step of ST13). That is, the component information updating processor 15 updates the number of electronic components P targeted for updating stored in the local database 13 by executing processing for decrementing the number of used electronic components P taken out of the supply reel 21 from the number of electronic components P (the remaining number) targeted for updating stored in the local database 13.

On the other hand, in the case of deciding that the component ID has been migrated in (ST12), the component information updating processor 15 updates component information about the component ID stored in the integrated database 4 based on the apparatus sending information (an integrated database updating step of ST14). In addition, at this time, the component information about the component ID stored in the local database 13 may be updated together. Thus, the component information updating processor 15 forms component information updating means for updating component information stored in the integrated database 4 based on component use information sent from the electronic component mounting apparatuses M3, M4.

According to the electronic component mounting system 1 of the embodiment thus, information about a use status (for example, the number of remaining electronic components P described above) of the electronic components P housed in the supply reel 21 and the supply reel 21 between the plural mounting line systems 10A, 10B can easily be shared on the integrated system 3. Consequently, the supply reel 21 in which electronic components usable in common between the plural mounting line systems 10A, 10B are housed can be mutually used in a state in which the number of electronic components P remaining housed in the supply reel 21 is grasped accurately.

Also, since component information can be migrated without stopping operation of each of the mounting line systems 10A, 10B, production efficiency of a mounting substrate is not decreased. Also, since the component information can gradually be migrated in a form accompanying daily work, a human burden for migration is not created newly. Further, since only information about the supply reel 21 used in the mounting line systems 10A, 10B is stored and updated in the integrated database 4, unnecessary component information about, for example, the supply reel 21 having out of the component or the old supply reel 21 without having the opportunity for use in component mounting work is not migrated, with the result that a storage area of the integrated database 4 can be downsized.

Moreover, in the embodiment, the supply reel 21 is described as the electronic component housing body, but a tray feeder (not shown) in which plural electronic components are housed in a box-shaped container (tray) with the upper surface opened may be used as the electronic component housing body. In such a case, a bar code on which a component ID is recorded is stuck on a desired place of the tray and the steps described above are executed and thereby, information about a use status of the electronic component housed in the tray feeder between plural mounting line systems can be shared on the integrated system 3.

The invention has been described in detail with reference to the specific embodiment, but it is apparent to those skilled in the art that various changes or modifications can be made without departing from the spirit and scope of the invention.

The present application is based on Japanese patent application (patent application No. 2012-233400) filed on Oct. 23, 2012, and the contents of the patent application are hereby incorporated by reference.

INDUSTRIAL APPLICABILITY

According to an electronic component mounting system of the invention, information about a use status of an electronic component between plural mounting line systems can easily be shared in a simple configuration, and the invention is useful in the electronic component mounting field in which the electronic components are mounted on a substrate to manufacture a mounting substrate.

DESCRIPTION OF REFERENCE NUMERALS AND SIGNS

1 ELECTRONIC COMPONENT MOUNTING SYSTEM
2 COMMUNICATION NETWORK
3 INTEGRATED SYSTEM
4 INTEGRATED DATABASE
10A, 10B MOUNTING LINE SYSTEM
12 MANAGEMENT SYSTEM
13 LOCAL DATABASE
14 COMPONENT INFORMATION READING PROCESSOR
15 COMPONENT INFORMATION UPDATING PROCESSOR
20 ELECTRONIC COMPONENT MOUNTING LINE
21 SUPPLY REEL
24 BAR CODE READER
M3, M4 ELECTRONIC COMPONENT MOUNTING APPARATUS
P ELECTRONIC COMPONENT

The invention claimed is:

1. An electronic component mounting system comprising plural mounting line systems, and an integrated system capable of communication with the plural mounting line systems,
wherein the plural mounting line systems comprise an electronic component mounting line comprising an electronic component mounting apparatus that takes an electronic component out of an electronic component housing body in which plural electronic components are housed and mounts the electronic component on a substrate,
a mounting line management unit which is connected to the electronic component mounting apparatus and comprises a local database for storing information about a use status of the electronic components in a unit of the electronic component housing body, and
an identification information reading unit which is communicably connected to the mounting line management unit and reads identification information attached to the electronic component housing body, and
the mounting line management unit comprises a component information reading unit that, when the identification information read by the identification information reading unit is not stored in an integrated database of the integrated system, reads from the local database and stores in the integrated database the identification information and information about a use status of the electronic components housed in the electronic component housing body to which the identification information is attached.

2. The electronic component mounting system according to claim 1, wherein the mounting line management unit further comprises a component information updating unit that updates component information stored in the integrated database based on component use information sent from the electronic component mounting apparatus.

3. The electronic component mounting system according to claim 1, wherein when information about a use status of the electronic components is stored in the integrated database, the component information reading unit attaches information to the effect that the information about the use status of the electronic components is stored in the integrated database to the local database.

* * * * *